US012775054B2

(12) United States Patent
Schulz et al.

(10) Patent No.: US 12,775,054 B2
(45) Date of Patent: Oct. 27, 2026

(54) MONITORING UNIT COMPRISING AN INTEGRATED MAGNETIC FIELD SENSOR

(71) Applicant: AT & S Austria Technologie & Systemtechnik Aktiengesellschaft, Leoben-Hinterberg (AT)

(72) Inventors: Gernot Schulz, Graz (AT); Thomas Krivec, Zeltweg (AT); Johannes Stahr, St. Lorenzen (AT)

(73) Assignee: AT & S Austria Technologie & Systemtechnik Aktiengesellschaft, Leoben (AT)

( * ) Notice: Subject to any disclaimer, the term of this patent is extended or adjusted under 35 U.S.C. 154(b) by 234 days.

(21) Appl. No.: 18/609,270

(22) Filed: Mar. 19, 2024

(65) Prior Publication Data

US 2024/0329163 A1 Oct. 3, 2024

(30) Foreign Application Priority Data

Mar. 30, 2023 (EP) .................................... 23165577

(51) Int. Cl.
*G01R 33/04* (2006.01)

(52) U.S. Cl.
CPC .................................... *G01R 33/04* (2013.01)

(58) Field of Classification Search
CPC .... G01R 33/04; G01R 33/0011; G01R 33/05; G01R 33/02
See application file for complete search history.

(56) References Cited

U.S. PATENT DOCUMENTS

| | | | | |
|---|---|---|---|---|
| 6,404,192 | B1 | 6/2002 | Chiesi et al. | |
| 6,429,651 | B1 | 8/2002 | Choi et al. | |
| 2010/0134101 | A1 | 6/2010 | Riva et al. | |
| 2011/0210722 | A1 * | 9/2011 | Paci | G01R 33/04 29/25.01 |
| 2020/0041582 | A1 | 2/2020 | Schulz et al. | |

FOREIGN PATENT DOCUMENTS

| | | | | |
|---|---|---|---|---|
| DE | 102010029668 | A1 * | 12/2011 | G01C 25/00 |
| JP | H08-179023 | A | 7/1996 | |
| KR | 10-1300028 | B1 | 8/2013 | |

* cited by examiner

*Primary Examiner* — Son T Le
(74) *Attorney, Agent, or Firm* — CM Law LLP

(57) ABSTRACT

A monitoring unit includes an integrated magnetic field sensor which includes at least one excitation coil and at least one sensor coil. Both coils are provided on one side of a first magnetic structure. The monitoring unit further includes a sensed element, which is associated with the integrated magnetic field sensor. The sensed element is suitable to alter the magnetic field of the integrated magnetic field sensor.

22 Claims, 3 Drawing Sheets

MONITORING UNIT COMPRISING AN INTEGRATED MAGNETIC FIELD SENSOR

CROSS REFERENCE TO RELATED APPLICATIONS

Applicant claims priority under 35 U.S.C. § 119 of European Application No. 23165577.0 filed on Mar. 30, 2023, the disclosure of which is incorporated by reference.

BACKGROUND OF THE INVENTION

1. Field of the Invention

The invention relates to a monitoring unit, comprising an integrated magnetic field sensor, a method to monitor a sensed element with an integrated magnetic field sensor, and the use of an integrated magnetic field sensor to monitor a sensed element. The invention further relates to a computer-readable medium, and a program element to monitor a sensed element.

2. Technological Background and Related Art

A conventional planar flux gate sensor comprises a magnetic core of a generally elongated shape overlying an energizing coil. By supplying the energizing coil with an appropriate AC excitation current, it is possible to bring the magnetic core into a series of cycles of magnetic saturation. Sensing of external fields is obtained via a pair of sensing coils, generally set underneath the ends of the magnetic core. For example, when the excitation coil is driven by a sinus signal and out of a high magnetic permeability of the magnetic material it will be driven into saturation, what means that the sensor coil will see a rectangular signal. An external field will drive the excitation coil into saturation a little earlier. This results in a time shift of the rectangular signal on the sensor coil, which time shift is proportional to the strength of the external field and can be easily measured.

KR 101300028 B1 discloses an orthogonal-type thin film flux-gate sensor unit, comprising a pair of input electrodes for applying a driving current and a magnetic thin film for generating an excitation magnetic field when current is applied. Both ends of the magnetic thin film are connected to the input electrode. A pair of planar detection coils having a labyrinth structure are arranged on one side of the magnetic thin film in such a manner as to intersect with the magnetic thin film in an orthogonal pattern repeatedly several times. A pair of detection electrodes is formed at the ends of the planar sensing coil and a connection lead is electrically connecting the ends of the planar sensing coil in series. An insulator film is electrically insulating the planar detection coil and the planar detection coil from each other. The magnetic thin film is in the form of a closed magnetic pole surrounding the input line.

The conventional flux gate sensor or generally sensors for detecting a magnetic field may require a voluminous space, may not be reliable in all conditions and may not have a sufficient accuracy or may not feature a desirable sensitivity.

Thus, there may be a need for a magnetic field sensor, in particular a flux gate sensor, or generally a magnetic field sensor, which requires less space, has a better reliability, an improved accuracy and/or an improved sensitivity, suitable to sense one or several kinds of sensed elements, which alters the magnetic field of the magnetic field sensor, depending of the application. Furthermore, there may be a need for a flux gate sensor having an improved energy efficiency, in particular requiring less energy or having a smaller energy consumption for operation, thereby assuring a reliable sensing operation of a sensed element in whatever condition the latter alters the magnetic field of the sensor.

SUMMARY OF THE INVENTION

The scope of the present invention is as defined by the subject-matter of the independent claims. The dependent claims specify particular embodiments of the present invention.

According to the present invention it is provided an integrated magnetic field sensor comprising at least one excitation coil and at least one sensor coil both provided on one side of a first magnetic structure; and a sensed element associated with said integrated magnetic field sensor, said sensed element being suitable to alter the magnetic field of the integrated magnetic field sensor. Preferably, a plurality of sensor coils is provided, resulting in lower power to achieve a high sensitivity.

The magnetic field sensor may be configured to measure a magnetic field or magnetic flux in at least one direction, in particular to measure strength and direction of a magnetic field, in particular an altering magnetic field. For achieving a 1D integrated magnetic field sensor, at least one excitation coil and two sensor coils or two windings of one sensor coil may be present. For achieving a 2D integrated magnetic field sensor, at least one excitation coil and four sensor coils (e.g. arranged in a plane) may be present. For achieving a 3D integrated magnetic field sensor, at least two excitation coils and six sensor coils may be present or an integrated field shaping element. The excitation coil and the sensor coils may be configured substantially in a same shape, for example configured as rectangular, circular or quadratic spirals.

In a preferred embodiment, the integrated magnetic field sensor has a planar shape, defining at least one, in particular two, main surfaces, wherein said main surface is arranged in front of the sensed element. This contributes to the compact design and at the same time assures the precise focus of the sensing toward the sensed element, through the proper alignment of the sensed element with respect to the planar surface.

For example, for a 1D integrated magnetic field sensor or a 2D integrated magnetic field sensor, the excitation coil and the sensor coil may substantially be arranged adjacent to each other side by side substantially in a same vertical height or position.

According to a further embodiment, a second magnetic structure is provided, the at least one excitation coil and the at least one sensor coil are provided between the first magnetic structure and the second magnetic structure. This results in an integrated magnetic sensor with higher sensing precision as well as with low power consumption.

The magnetic structures may be magnetizable and may for example comprise ferromagnetic or ferrimagnetic material. The magnetic structures usually do not have a permanent magnetic field or do not generally generate their own magnetic field but are magnetizable and highly permeable to magnetic fields. The excitation coil when supplied with an appropriate AC current, may generate a magnetic field in the first magnetic structure and, if present, also in the second magnetic structure, during operation of the integrated magnetic field sensor. Herein, in the first magnetic structure as well as in the second magnetic structure, due to the relative arrangement of the excitation coil and the first magnetic structure and the second magnetic structure, magnetic fields may be generated (within the first magnetic structure and/or the second magnetic structure) which point in opposite directions as it is known from conventional flux gate sensors. Both, the first magnetic structure and also the second magnetic structure may be a continuous structure, for example each being integrally formed. The first magnetic structure and/or second magnetic structure may have a similar or same thickness, for example between 1 μm and 500 μm, in particular between 10 μm and 100 μm or have different thicknesses depending on the respective material and/or the desired goal. The first magnetic structure and the second magnetic structure may be made of different materials and may have a same or a different shape.

The first magnetic structure (also referred to as core plate) as well as the second magnetic structure may focus magnetic flux lines therein and in particular the second magnetic structure may contribute to enclosing the magnetic flux lines to concentrate them into the magnetic structures. By concentrating the magnetic flux lines within the first magnetic structure and/or the second magnetic structure, the energy required to drive the excitation coil to generate an alternating magnetic field may be reduced. Thereby, to achieve a similar sensitivity as a conventional flux gate sensor, less energy for driving the excitation coil may be required. The first magnetic structure as well as the second magnetic structure may be configured as a foil or a sheet or plate primarily extending in a plane parallel to the electrically insulating layer structures of the component carrier. The first magnetic structure and/or the second magnetic structure may for example be composed of different materials and/or are configured as a foil or sheet and may be made by cutting appropriate shapes from pre-fabricated foils which may be conventionally available or from conventionally available metal sheets, such as used for conventional transformers. Different materials for the first and second magnetic structure may improve sensitivity and/or lower energy consumption of the integrated magnetic field sensor. Both, the first magnetic structure and the second magnetic structure may be highly magnetically permeable but may be characterized by different hysteresis curves.

Preferably, the first magnetic structure and/or the second magnetic structure can be made of a soft magnet material having a high maximum DC magnetic permeability, in particular approximately 100000 $Hm^{-1}$ or higher for the first magnetic structure and at least 500 $Hm^{-1}$ for the second magnetic structure, the material in particular comprising a (poly)crystalline an amorphous, in particular cobalt-based, metal alloy, the material in particular comprising at least one of Co, Ni, Si, Fe, Mo, mu-metal, a type of MetGlas, a type of Vitrovac. When the first magnetic structure and/or the second magnetic structure has a high magnetic permeability as given above by way of example, they may efficiently focus magnetic field lines within the magnetic structures, thereby improving the sensitivity or reducing energy consumption.

The material of the first magnetic structure is preferably characterized by a steeper hysteresis curve than the material of the second magnetic structure, and/or a magnetizing field at which a permeability is smaller for the material of the first magnetic structure than for the material of the second magnetic structure, and/or a magnetic reversal loss is smaller for the material of the first magnetic structure than for the material of the second magnetic structure, and/or the material of the second magnetic structure requires a higher external field strength to reach magnetic saturation than the first magnetic structure. The first and second magnetic material may have different saturation magnetizations. The first magnetic structure may for example be characterized by a hysteresis curve which essentially has a kink after a steep increase, wherein the kink substantially is located at a magnetization which essentially equals to the saturation magnetization. Thus, the material of the first magnetic structure may essentially reach saturation for a lower magnetizing field than the material of the second magnetic structure. Less energy may be required to reverse the magnetization of the material of the first magnetic structure than to reverse the magnetization of the material of the second magnetic structure. The magnetic permeability generally may change with a varying magnetizing field. The permeability of both the materials of the first magnetic structure as well as the second magnetic structure may, starting from a vanishing magnetizing field, may increase to adopt a maximum at a particular magnetizing field and may then decrease, as saturation of the magnetization is reached. The magnetic reversal loss may correspond to an area enclosed by the hysteresis curves of the respective materials. The magnetic reversal loss may be related to the energy required to magnetize the respective material or reverse its (saturated) magnetization. When one of these properties of the material of the first and second magnetic structure is satisfied, and if further the shape of the first and second magnetic structure are appropriately selected or designed, the sensitivity can be increased, or the energy consumption can be decreased. Selection of material and shape may lead to improved energy efficiency and/or sensitivity.

An area of a lateral extension of the first magnetic structure and/or an area of a lateral extension of the second magnetic structure is preferably equal as or smaller than, in particular between 20% and 40% of, a sum of areas of lateral extensions of the excitation coil and the sensors coils. The area of the lateral extensions may be selected, for example such that saturation of the magnetization in the first magnetic structure is achieved during operation, while saturation of the magnetization is not reached in the second magnetic structure. The lateral extension of the first magnetic structure and/or the second magnetic structure may be largest in the direction in which the component of the external magnetic field is to be detected. In direction perpendicular to these directions, the extension may be smaller (e.g. smaller than the extension of the coils), thereby saving material. Further, a lateral shape of the first magnetic structure and/or the second magnetic structure may substantially equal a shape of a lateral region, or a diminished lateral region, covered by the excitation coil and the sensors coils. The first magnetic structure and/or the second magnetic structure may completely overlap the excitation coil and the sensor coils in a projection perpendicular to the plane of the coils or the integrated magnetic field sensor as a whole. Thereby, magnetic flux lines may be focused and concentrated within the first and the second magnetic structures. The lateral region covered by the excitation coil and the sensor coils may for example have a cross-shape, wherein for example corners or side edges of the excitation coil and the sensing coils are closest to each other.

The excitation coil, the first magnetic structure and the second magnetic structure can be configured, in particular together with a driver circuitry for the excitation coil, such that the excitation coil generates an alternating magnetic field, in particular having a frequency between 1 and 200 kHz, further in particular between 10 and 100 kHz, that saturates a magnetization in the first magnetic structure, while not saturating the magnetization in the second magnetic structure. When the material of the second magnetic structure is not saturating during operation of the integrated magnetic field sensor, the sensitivity can be increased and/or the energy consumption can be reduced.

In the context of this document it is noted that the strength of the magnetic field and/or the magnetic flux may be dependent of temperature. For example, by increase of the temperature the strength of the magnetic field and/or the magnetic flux may increase or decrease. Preferred, at least one of the excitation coil and the sensors coils has windings formed as one or more spiraled squares or rectangles, two of the sensor coils being arranged adjacent to the excitation coil such that lateral mid points of the two sensors coils are connectable by a straight line running through a lateral midpoint of the excitation coil, the straight line in particular running through corners of windings of the excitation coil or running through and perpendicular to side edges of windings of the excitation coil. Thereby, a compact arrangement may be achieved or an arrangement where the magnetic structures cover a higher area of windings of the coils.

An amount of an extension of the first magnetic structure and/or the second magnetic structure along the straight line could be between a distance of the lateral mid points of the two sensor coils and a distance between ends of the two sensor coils along the straight line. It has been found in experiments that the extension of the first and/or the second magnetic structure is not necessary the same as the extension of the combination of the excitation coil and the (adjacent) sensing coils but may be a little bit smaller to reach only mid points of sensing coils being arranged each adjacent to the (central) excitation coil. Thereby, material may be saved, while the sensitivity and energy consumption are maintained as desired.

The number of excitation coils is at least two, the number of sensors coils is at least six, wherein four of the sensors coils and one excitation coil are arranged substantially in a coplanar arrangement, the other two sensors coils and one other excitation coil are oriented perpendicular to the coplanar arrangement on the same electrically insulating layer structures in a region laterally beside the four sensor coils, the region being bend by substantially 90°.

An optional further embodiment is characterized in that the integrated magnetic field sensor comprises at least partially a planar shape extending along a planar plane, wherein the at least one excitation coil and the at least one sensor coil are provided between the first magnetic structure and the second magnetic structure along the direction transversal, in particular perpendicular, with respect to said planar plane. The excitation coil and the sensors coils are arranged at least partially coplanar, in particular adjacent to each other. This provides a compact design integrated in a planar and thin structure.

A further embodiment according to the invention is characterized in that the distance between at least one excitation coil and at least one sensor coil with respect to the first magnetic structure and/or the second magnetic structure is the same.

The integrated magnetic field sensor for a monitoring unit may have a stack comprising at least one electrically insulating layer structure and at least one electrically conductive layer structure. This may bring the advantage of manufacturing a monitoring unit using well-established and highly reliably manufacturing processes in terms of efficiency and quality originated from PCB technology.

Such monitoring unit can be further characterized in that the at least one excitation coil and/or at least one sensor coil is at least partially formed by the at least one electrically conductive layer structure, in particular by a plurality of electrically conductive layer structures. This may bring the advantage of integration of the excitation coil and/or at sensor coil in the stack manufactured through the well-established and highly reliably manufacturing processes of PCB technology.

A further embodiment comprises a monitoring unit wherein the at least one excitation coil and/or the at least one sensor coil comprises conductive windings, in particular at least partially formed by one or on a plurality, in particular between 2 and 6, electrically insulating layer structures.

In this embodiment, the stack structure supporting the integrated magnetic field sensor and possibly also the sensed element could be for example a component carrier, which may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term “layer structure” may particularly denote a continuous layer, a patterned layer or a plurality of nonconsecutive islands within a common plane. In an embodiment, the component carrier is shaped as a plate, which is preferred for a planar shape integrated magnetic field sensor. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

The component carrier can further be configured as one of the group consisting of a printed circuit board, and a substrate (in particular an IC substrate). In the context of the present application, the term “printed circuit board” (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of metal, for example copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. In the context of the present application, the term “main surface” of a body may particularly denote one of two largest opposing surfaces of the body or outermost opposing surfaces of the body. A dielectric part of a PCB may be composed of resin with reinforcing fibers (such as glass fibers).

In the context of the present application, the term “substrate” may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

The at least one electrically insulating layer structure can comprise at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

The at least one electrically conductive layer structure may comprise at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can, in addition to the integrated magnetic field sensor and the parts thereof and/or the sensed element, be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a soft magnetic element, in particular a ferromagnetic element, an antiferromagnetic element or a ferrimagnetic element, for instance a ferrite core or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked, in particular parallel stacked, and connected together by applying a pressing force, if desired accompanied by heat.

The component carrier may be configured to carry further electric and/or electronic components, such as resistances, capacitors, diodes, transistors, or integrated circuits. The flux gate sensor is capable of measuring at least one component of an external magnetic field, for example providing a 1D flux gate sensor. For achieving a 1D integrated magnetic field sensor, at least one excitation coil and two sensor coils or two windings of one sensor coil may be present. For achieving a 2D integrated magnetic field sensor, at least one excitation coil and four sensor coils (e.g. arranged in a plane) may be present. For achieving a 3D integrated magnetic field sensor, at least two excitation coils and six sensor coils may be present or an integrated field shaping element.

The excitation coil and the sensor coil may be realized for example by appropriately etched copper traces etched on the electrically insulating layer structures. In a different example, the excitation coil and the sensor coil may be realized by an additive manufacturing process, i.e. (m)SAP. The excitation coil and/or the sensor coil may be present on one or more of the electrically insulating layer structures. Portions of the excitation coil and/or the sensor coils on different layers may be electrically connected via through-holes or vias.

For a 1D integrated magnetic field sensor or a 2D integrated magnetic field sensor, the excitation coil and the sensor coil may substantially be arranged adjacent to each other side by side substantially in a same vertical height or position. For example, the excitation coil and the sensor coil or at least portions thereof may be formed on a same layer of the electrically insulating layers or layer structures. Thereby, manufacturing may be simplified. In one layer, the excitation coil and/or the sensor coil may for example comprise N windings, where N is more than 1, e.g. between 2 and 20 windings, in particular between 2 to 6 windings. The excitation coil and the sensor coils may for example be arranged in between M coils, where M is more than 1, e.g. between two and six or even greater, in particular four stacked layers. E.g. within a n-layer component carrier or PCB, a m-layer integrated magnetic field sensor may be integrated. The excitation coil and the sensor coils may be configured substantially in a same shape, for example configured as rectangular, circular or quadratic spirals. The windings may for example be formed as copper traces. The excitation coil and the sensor coils may for example be manufactured by etching a copper layer covering insulating layer structure.

The excitation coil may be comprised of electrically conductive windings on less layers than the electrically conductive windings of the sensing coils, for example if the magnetic field generated by the excitation coil drives the magnetization in the first magnetic structure in saturation. In this situation, on some of the dielectric layers portions of the excitation coil and portions of the sensing coil may commonly be arranged, in particular side by side. In other dielectric layers, only portions of the sensing coils may be arranged and which may be laterally larger than the portions of the sensing coil in the dielectric layers commonly used for harboring portions of the excitation coils as well as portions of the sensing coils. Thus, in this situation, the sensing coils may be formed from winding portions in different dielectric layers having different sizes. Thereby, the sensitivity may be improved.

The magnetic structures may be magnetizable and may for example comprise ferromagnetic or ferrimagnetic material. The magnetic structures usually do not have a permanent magnetic field or do not generally generate their own magnetic field but are magnetizable and highly permeable to magnetic fields. The excitation coil when supplied with an appropriate AC current, may generate a magnetic field in the first magnetic structure and also in the second magnetic structure during operation as a flux gate sensor. Herein, in the first magnetic structure as well as in the second magnetic structure, due to the relative arrangement of the excitation coil and the first magnetic structure and the second magnetic structure, magnetic fields may be generated (within the first magnetic structure and/or the second magnetic structure) which point in opposite directions as it is known from conventional planar flux gate sensors. Both, the first magnetic structure and also the second magnetic structure may be a continuous structure, for example each being integrally formed. The first magnetic structure and/or the second magnetic structure may be formed directly on one of the electrically insulating layer structures or may be pre-fabricated and may be attached to one of the electrically insulating layer structures. The first magnetic structure and/or second magnetic structure may have a similar or same thickness, for example between 1 μm and 500 μm, in particular between 10 μm and 100 μm or have different thicknesses depending on the respective material and/or the desired goal. The first magnetic structure and the second magnetic structure may be made of different materials and may have a same or a different shape. A vertical distance between the excitation coil and the sensor coils on one hand and the first magnetic structure may be substantially equal or at least similar to a vertical distance between the excitation coil and the sensor coils on one hand and the second magnetic structure on the other hand. The first magnetic structure and the second magnetic structure may sandwich the excitation coil and the sensor coils therebetween. The first magnetic structure as well as the second magnetic structure may extending in a plane parallel to the electrically insulating layer structures of the component carrier.

For an integrated magnetic field sensor incorporated in or supported by a stack, layer structure or component carrier as explained above, the excitation coil and the sensors coils are preferably arranged at least partially coplanar on and/or in the layer structures, in particular adjacent to each other. In the layer structures, the excitation coil and the sensor coils may substantially extend over a same vertical height. For example, the excitation coil may not be above or below the sensor coils but may be substantially in a same vertical range. When the excitation coil and/or the sensor coil are configured to extend over several layers of the insulating layer structures, at least portions of the excitation coil and portions of the sensor coils may be arranged coplanar to each other, in particular in a same layer of the electrically insulating layer structures, or on the electrically insulating layer structures. When the excitation coil and the sensor coils are at least partly coplanar to each other, they may be manufactured on a same layer, thereby simplifying the manufacturing.

The integrated magnetic field sensor for a monitoring unit is characterized in that it is fixedly associated with the sensed element. In particular said integrated magnetic field sensor is connected with the sensed element. In that case, a compact and low power consumption device is needed due to the fixed association of the latter with the sensed component.

A monitoring unit according to a further embodiment comprises an integrated magnetic field sensor being movably associated with the sensed element or vice versa. In a specific embodiment, the sensed element and the sensor are in particular movable along a fixed direction, for example along a straight or curved line or a sequence of straight or curved lines. Another embodiment provides for a movement along a random direction or in deliberate manner. The proper association of the surface of the integrated magnetic field sensor with the sensed element, the former configured according to the present invention, allows a precise recognition of the alteration of the magnetic field even if the sensed element is movably with respect to the integrated magnetic field sensor. This preferred embodiment allows the sensing of a structure altering the magnetic field through the change of position of the integrated magnetic field sensor with respect to the sensed element physical extension.

The sensed element of a preferred embodiment of a monitoring unit according to the present invention is rotatable around a rotation axis. According to this preferred embodiment, even if the speed and the shape of a rotatable sensed element would affect the sensing reliability of the integrated magnetic field sensor, the configuration of the latter in accordance to the present invention leads to a high sensitive sensing allowing the recognition of the magnetic field alteration even in case of a high (peripheral) speed as well as a non-planar shape.

According to a further embodiment of the present invention, the integrated magnetic field sensor is provided in proximity or is suitable to be placed as to be at the proximity of the sensed element. A particular embodiment according to the present invention is characterized by the integrated magnetic field sensor in contact with the sensed element. The high reliability of the integrated magnetic field sensor according to one embodiment of the present invention allow a high preciseness and reliability not mandatorily requiring the physical contact between the sensor and the sensed element.

According to a further embodiment of the present invention, the at least one excitation coil and/or the at least one sensor coil is provided at a distance or is suitable to be placed as to be at a distance from the sensed element equal or less of 20 μm. By experimental tests, it has been discovered that for an integrated magnetic sensor according to the invention manufactured with a PBC-type technology, proper sensing preciseness and reliability can be guaranteed up to a maximum distance of 20 μm between at least one coil of the sensor and the sensed element.

According to a further embodiment of the present invention, the sensed element is at least partially made of metallic material. This preferred material matches with the sensing magnitude of the integrated magnetic sensor according to the invention.

According to a further embodiment of the present invention, the sensed element is configured to allow the electric current passage through said element. This preferred embodiment allows a functional optimization as well as an energy saving solution, activating the integrated magnetic sensor only when required, for example in accordance to a temporary plan, when the sensed component in the proximity/in contact with the sensor, etc.

According to a further embodiment of the present invention, the sensed element comprises an electrically conductive wiring structure.

According to a further embodiment of the present invention, the sensed element comprises a stack of at least one electrically insulating layer structure and at least one electrically conductive layer structure, wherein the integrated magnetic field sensor is associated to at least a portion of said at least one electrically conductive layer structure.

According to a further embodiment of the present invention, the integrated magnetic field sensor is at least partially integrated in the stack.

According to a further embodiment of the present invention, the integrated magnetic field sensor comprises at least a portion of at least one electrically conductive layer structure and/or at least a portion of the electrically insulating layer structure of the stack.

According to a further embodiment of the present invention, the sensed element comprises or consists of at least one electronic component. According to a still other embodiment, the sensed element comprises or consists of a plurality of electronic components.

According to a further embodiment of the present invention, the sensed element comprises at least one chamber, in particular one cell, configured to that the electric current can flow from one portion to another portion, wherein the integrated magnetic field sensor is provided on or in or in proximity of one or more chambers/cells. This allows the advantageous application of the sensor in fields such as electric batteries, where chambers and current flow is associated.

According to a further embodiment of the present invention, the sensed element at least partially comprises a cylindrical shape.

According to the present invention it is provided a method to monitor a sensed element with a monitoring unit configured according to any one of the preceding paragraphs, comprising the step of measuring at least one component of a magnetic field through an integrated magnetic field sensor configured according to any one of the preceding paragraphs, when the integrated magnetic field sensor and the sensed component are associated one to each other. The magnetic field can be generated by the sensed component or can be generated by the magnetic field sensor. In the latter case, the alterations or modifications of the magnetic field are detected, which alterations or modifications are caused by the influence of the sensed component. This may bring the advantage of assuring reliable sensing even at alternating conditions, for example alternating temperature and/or moving constituents (sensed element and/or at least one component).

Preferably, this method is further characterized in that the sensed element comprises an electrically conductive material, the method comprising the step to provide the electric current passage through the sensed element.

According to a further embodiment of the present invention, the first magnetic structure and/or the second magnetic structure is/are configured to generate a magnetic field if supplied by an electric current, and the method is further comprising the step of supply electric current to the first magnetic structure and/or the second magnetic structure when monitoring the sensed element. This may bring the advantage of optimization of electric power consumption since the first magnetic structure and/or the second magnetic structure is/are supplied with electric current exclusively when necessary.

According to a further embodiment of the present invention, the method is further comprising the step of measuring the at least one component of the magnetic field over time. For example, this could be done by continuous measurement, measurements according to a duty cycle or by measurements triggered by the receipt of a command (automatically provided or by manual input by an operator). This may bring the advantage of monitoring and/or checking values, for example the magnetic strength, of the magnetic field alternation in accordance with a trend evaluation along the time. For example, the use of different methods or logic combinations of data deriving from the specific measurement over the time may bring the flexibility to check said values.

According to a further embodiment of the present invention, the method is further comprising the step of estimating the health condition of the sensed element, in particular combining the measured values with a damage curve. This may bring the advantage of simulating and/or monitoring a life cycle of for example a component, preferably in association with a component carrier.

According to a further embodiment of the present invention, the step of the estimation of the health condition comprises the estimation of the remaining time that a single component carrier complies with specific threshold conditions. This may bring the advantage of reliable online monitoring, which may initiate further actions, for example information of a human operator at specific threshold conditions.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board (PCB), an organic interposer, and an IC (integrated circuit) substrate. A component carrier may also be a hybrid board combining different ones of the above-mentioned types of component carriers.

According to a further embodiment of the present invention, the method is further comprising the step of defining a change of condition of the sensed element when the result of the measure of the at least one component of the magnetic field reaches or exceeds a threshold value.

According to the present invention it is provided the use of a an integrated magnetic field sensor to monitor a sensed element, said integrated magnetic field sensor comprising at least one excitation coil and at least one sensor coil, both provided on one side of a first magnetic structure, said sensed element being suitable to alter the magnetic field of the integrated magnetic field sensor, wherein the integrated magnetic field sensor and the sensed element are associated one to each other altering the magnetic field provided by the integrated magnetic field sensor. The magnetic field can be generated by the sensed component or can be generated by the magnetic field sensor. In the latter case, the alterations or modifications of the magnetic field are detected, which alterations or modifications are caused by the influence of the sensed component.

Preferred is a use wherein the sensed element comprises a wiring structure.

According to a further embodiment of a use according to the present invention, the sensed element comprises a stack of at least one electrically insulating layer structure and at least one electrically conductive layer structure, wherein the integrated magnetic field sensor is associated to at least a portion of said at least one electrically conductive layer structure.

According to a further embodiment of a use according to the present invention, the sensed element comprises or consists of an electronic component and/or a plurality of electrical components.

According to a further embodiment of a use according to the present invention, the sensed element comprises a metallic body, in particular the monitoring comprises the estimation of defects in said body.

According to a further embodiment of a use according to the present invention, the sensed element is comprised in an electric/electronic battery.

According to a further embodiment of a use according to the present invention, the sensed element comprises a body moving closer to the integrated magnetic field sensor.

According to the present invention it is provided a computer-readable medium, in which a computer program to monitor a sensed element, which computer program, when being executed by one or a plurality of processors, is adapted to carry out or control a method as described in the preceding paragraphs.

According to the present invention it is provided a program element to monitor a sensed element, which program element, when being executed by one or a plurality of processors, is adapted to carry out or control a method as described in the preceding paragraphs.

BRIEF DESCRIPTION OF THE DRAWINGS

Embodiments of the present invention are now described with reference to the accompanying drawings. The invention is not limited to the illustrated or described embodiments.

In the drawings.

DETAILED DESCRIPTION OF EMBODIMENTS OF THE INVENTION

Figure 1:
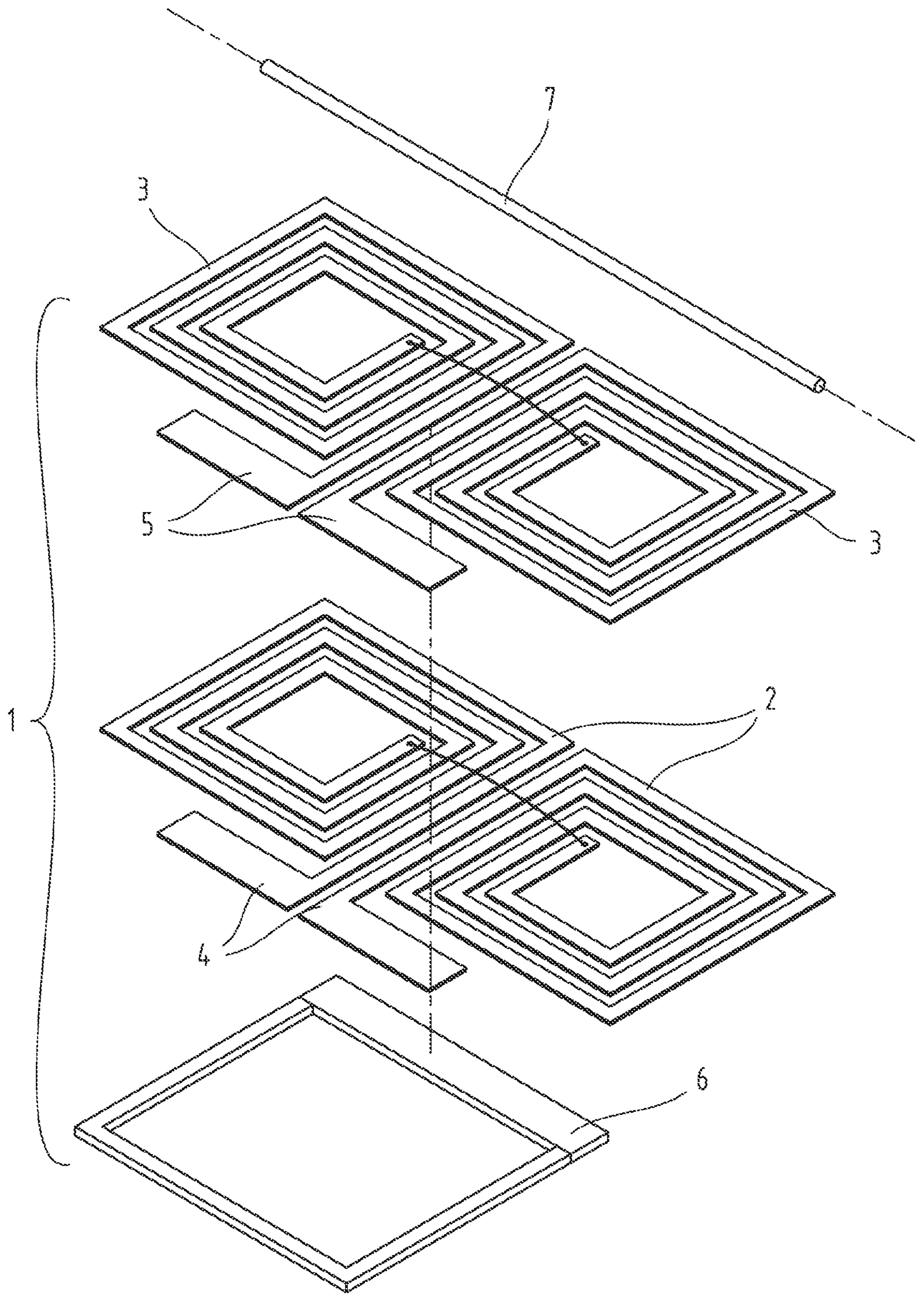
FIG. 1 schematically illustrates an explosion view of a basic embodiment of a monitoring unit comprising an integrated magnetic field sensor according to the present invention and a sensed element.

As shown in the explosion view of FIG. 1 the system according to the invention comprises of at least one integrated magnetic field sensor 1 with a new design i.e. comprising at least one excitation coil 2 and at least one sensor coil 3. Preferably, a plurality of sensor coils 3 is provided when operation with less power and high sensitivity is desired. In such embodiments, the at least one excitation 2 coil is preferably arranged between at least two sensor coils 3. As is understood, also a plurality of excitation coils 2 can be provided.

A driving current can be applied to the excitation coils 2 via input electrodes 4. The signal of the sensor coils 3 can be accessed via output electrodes 5. Both types of coils 2, 3 are provided on one and the same side of a first magnetic structure 6. Preferably, the coils 2, 3 are of a labyrinth structure and arranged to cross the area of the magnetic structure 6 preferably several times. Furthermore, FIG. 1 illustrates that the at least one excitation coil 2 can be sandwiched between the first magnetic structure 6 and the at least one sensor coil 3. Moreover, the at least one excitation coil 2 and the at least one sensor coil 3 can be congruently stacked in stack thickness direction without direct contact, while the centers of the at least one excitation coil 2 and the at least one sensor coil 3 can be transversally shifted (in at least one main extension of the stack) to the center of the magnetic structure 6 (indicated by the semicolon line). In a different example, the center of magnetic structure 6 may be located such that it is centered along the stack direction with respect to the planar extension defined by both the excitation coil 2 and the sensor coil 3 (not shown). Further in the preferred embodiment shown in FIG. 1, the two excitation coils 2 and the two sensor coils 3 are provided, each couple being arranged to create pairs, respectively, which are mirror-imaged structures. One of said mirror-imaged structures of the respective couple has a clockwise rotation, whereas the other respective mirror-imaged structure has a counter-clockwise rotation. The ends of the respective pairs located in the central portion of the labyrinth structure can be connected with each other having the effect of creating a small overall magnetic field (smaller than $10^{-9}$ T, when electric current is applied), since the respective single magnetic field created by each constituent of the pairs compensate each other. Gaps between the above-described constituents may be filled with electrically conductive material and/or electrically insulating material (not shown).

A sensed element 7 is associated with said integrated magnetic field sensor 1, said sensed element 7 being suitable to alter the magnetic field of the integrated magnetic field sensor 1. In one example, the sensed element 7 can be located such that the imaginary straight line from the centers of the at least excitation coil 2 and the at least one sensor coil 3 intersects with the sensed element 7. Preferably, the sensed element 7 is at least partially made of metallic material and/or is configured to allow the electric current passage through said element 7. FIG. 1 shows a first example for a sensed element 7 in the form of an electric conductor as the basic embodiment of an electrically conductive wiring structure.

Figure 2:
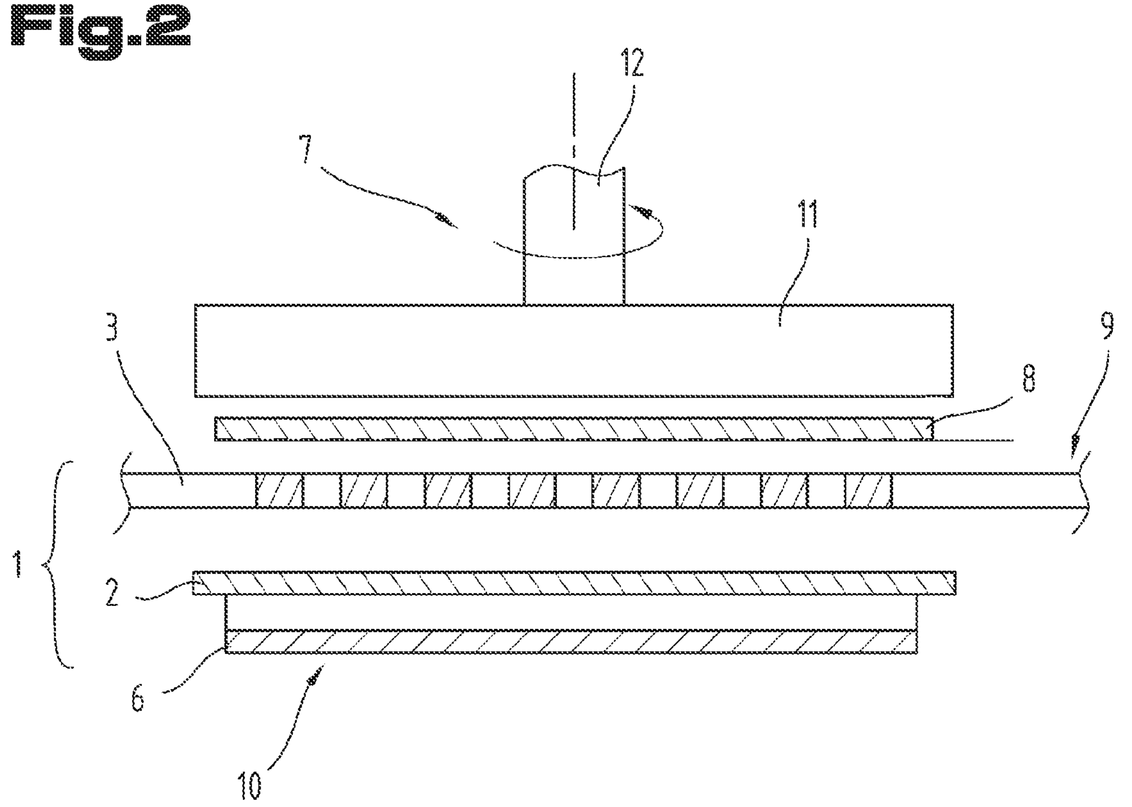
FIG. 2 is a schematic sectional view of a further embodiment of a system comprising an integrated magnetic field sensor according to the present invention and a sensed element.

FIG. 2 shows an embodiment slightly different from the one of FIG. 1, in a side sectional view. Again, at least one sensor coil 3 is, by way of example, arranged near at least one excitation coil 2, both coils 2, 3 provided on one and the same side of a magnetic structure 6. In the embodiment of FIG. 2, again by way of example, a second magnetic structure 8 is provided, the at least one excitation coil 2 and the at least one sensor coil 3 are provided in the space between the first magnetic structure 6 and the second magnetic structure 8, positioned at a certain distance from the first magnetic structure 6.

As clearly shown in FIGS. 1 and 2, the integrated magnetic field sensor 1 according to the invention can have a planar shape, defining at least one main surface 9. Said main surface 9 lies preferably essentially parallel to the plane containing the detection coil 3 or the plurality of detection coils 3 and said main surface 9 will typically be arranged in front of the sensed element 7. In this case, the first main surface 9 can be coplanar with one surface of the sensor coil

3. A second main surface 10 can be defined on the opposite side of the first main surface 9, giving the integrated magnetic field sensor 1 an overall flat, planar shape. Preferably, said second main surface 10 lies essentially parallel to the plane containing the excitation coil 2 or the plurality of excitation coils 2 and said second main surface 10 is facing away from the sensed element 7.

Optionally, the integrated magnetic field sensor 1 as a whole comprises at least partially a planar shape extending along a planar plane. Here, the at least one excitation coil 2 and the at least one sensor coil 3 are provided between the first magnetic structure 6 and the second magnetic structure 8 along the direction transversal, in particular perpendicular, with respect to said planar plane.

FIG. 2 further illustrates another embodiment of a sensed element 7, here in the form of a flat structure, for example a disc-like element 11 supported on a rod 12. Rod 12 can define a rotational axis for the disc-like element 11, the sensed element 7 being consequently rotatable around a rotation axis, which itself could be rotatable. According to a further embodiment of the present invention, the sensed element 7 could for example comprise at least one chamber, in particular one cell, configured to that the electric current can flow from one portion to another portion, in particular a cell of an accumulator or a fuel cell or a plurality of such cells. In this context, the sensed element 7 can be directly comprised in an electric/electronic battery or accumulator or even a fuel cell or similar arrangement. Preferably, the integrated magnetic field sensor 1 is in that case provided on or in or in proximity of one or more chambers/cells. The sensed element can at least partially comprise a cylindrical shape, too.

Figure 3:
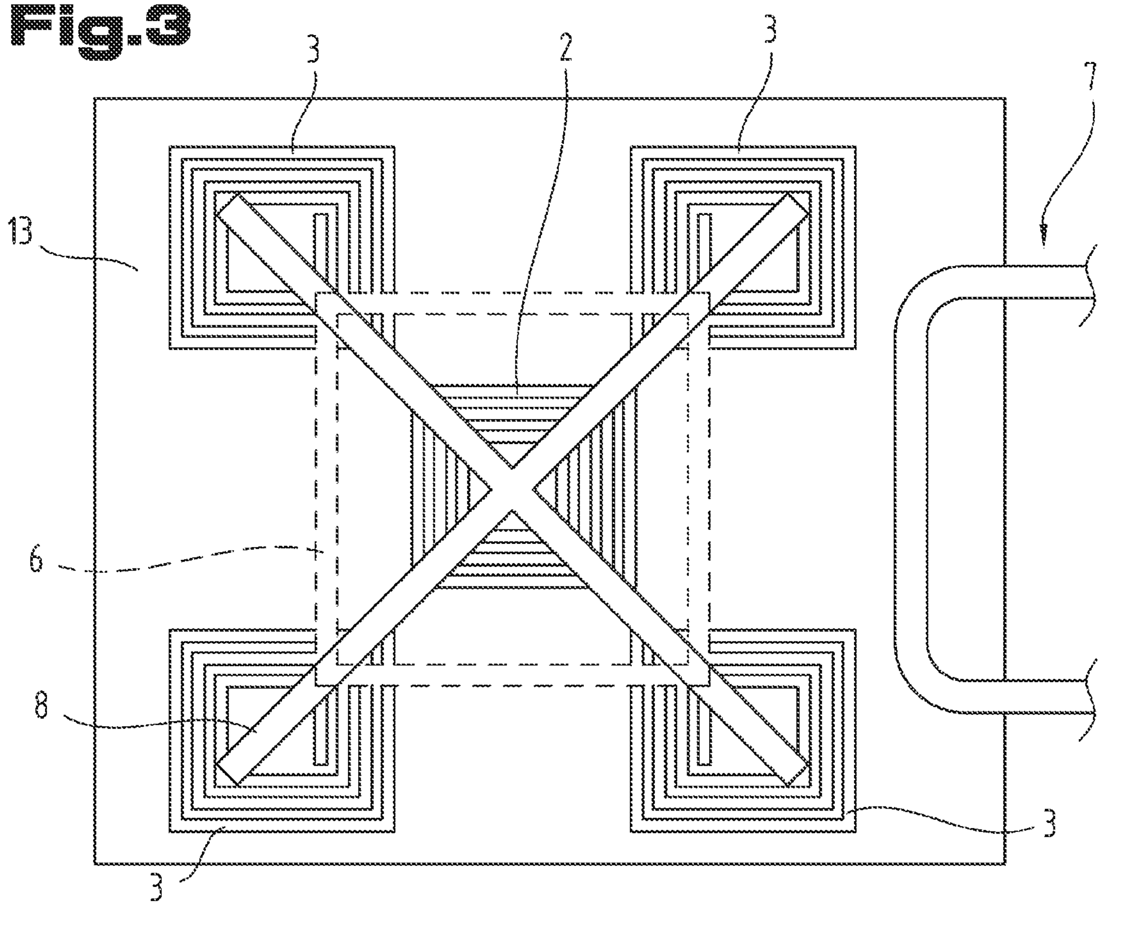
FIG. 3 schematically illustrates in a top view a still further embodiment of a system comprising an integrated magnetic field sensor according to the present invention and a sensed element.

FIG. 3 shows a further embodiment according to the present invention, characterized in that the distance between at least one excitation coil 2 and at least one sensor coil 3 with respect to the first magnetic structure 6 and/or the second magnetic structure 8, if present, is the same. Both coils 2, 3 or plurality of coils 2, 3 of different kind are consequently arranged essentially in the same plane, with the magnetic structures 6, 8 arranged above and below said plane, respectively.

The exemplary embodiment of FIG. 3 comprises one excitation coil 2 in the middle of a quadratic arrangement of four sensor coils 3, the coils 3 positioned at the corners of the square. One of the magnetic structures 6 is provided in the form of a quadratic frame, lies below the supporting structure 13 for the sensor 1, and therefore drawn in dotted lines. The second magnetic structure 8 is shaped like a cross, with its legs extending diagonally between the sensor coils 3 in opposite corners of the square arrangement. The middle of the legs of the second magnetic structure 8 cross in position of main surface extension where the center of the excitation coil 2 is located.

The sensed element 7 is illustrated by way of example in the form of bow of an electric conductor, passing near two sensor coils 3 of the quadratic arrangement of the four coils 3.

The sensor 1 according to the present invention can with advantage be used to implement a method step of measuring at least one component of a magnetic field over time. Measurements could be done continuously and/or according to a duty cycle. Further, measurements could be triggered by the receipt of a command (automatically provided or by manual input by an operator), preferably at consecutive specific moments. Such alterations of a magnetic field of a sensed element 7 could indicate the condition of said element 7, for example the health condition, in particular when the measured values of the magnetic field are combined with a damage curve. The method step of the estimation of the health condition of element 7 can for example comprise the estimation of the remaining time that a single component carrier complies with specific threshold conditions. The sensor 1 could be attached directly to the component carrier, for example a structure comprising dielectric layers, the latter serving also as support structure 13 for the integrated magnetic field sensor 1. Such variant of this method could further comprise a step of defining a change of condition of the sensed element 7 when the result of the measure of the at least one component of the magnetic field reaches or exceeds a threshold value.

Figure 4:
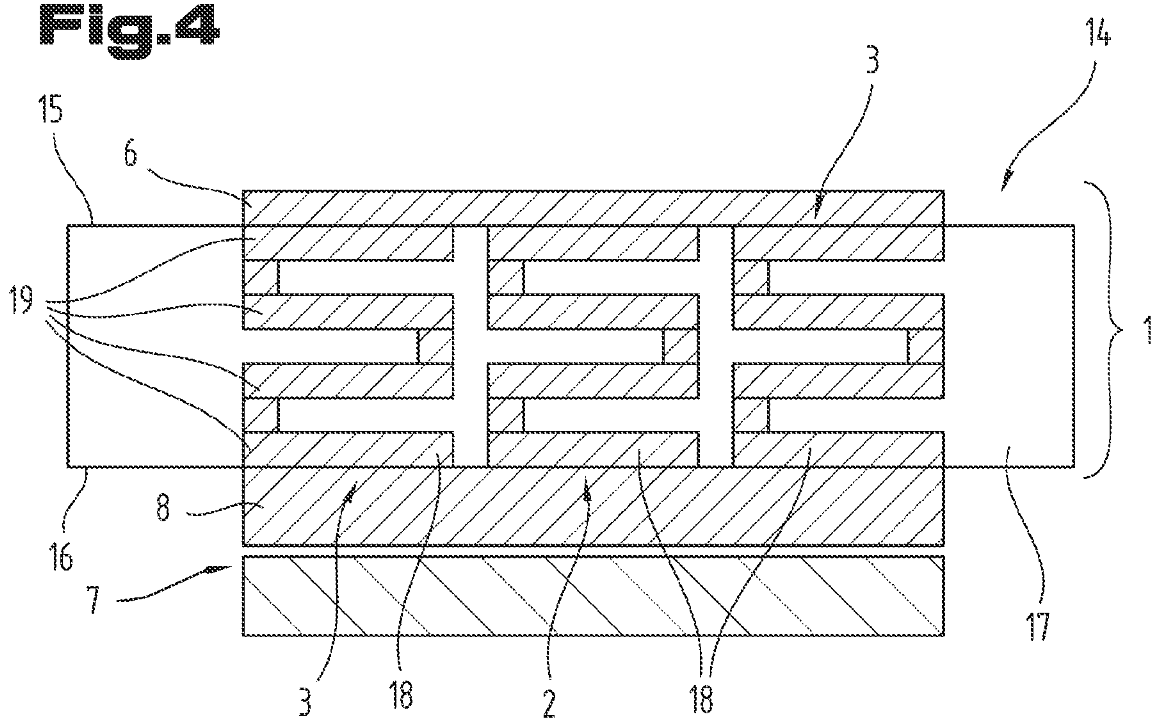
FIG. 4 schematically illustrates in an elevational sectional view a still further embodiment of a system comprising an integrated magnetic field sensor according to the present invention and a sensed element, implemented in form of a component carrier.

FIG. 4 shows a further embodiment of an integrated magnetic field sensor 1 according to the invention, implemented in or as a component carrier 14, for example built as a stack or layer structure comprising at least one electrically insulating layer structure and at least one electrically conductive layer structure, preferably in essentially planar shape, preferably on both opposite surfaces. The component carrier 14, shown in an elevational sectional view in FIG. 4, comprises one excitation coil 2 and the sensor coils 3 arranged such that a side edge of the central excitation coil 2 and a respective side edge of the sensing coils 3 are arranged adjacent to each other/side-by-side to each other. A first magnetic structure 6 is attached to one preferably planar surface 15 of the component carrier 14, and a second magnetic structure 8 can optionally be attached to the opposite, also preferably planar surface 16 of the component carrier 14. Again, all coils 2, 3 are on the same side of the first magnetic structure 6 or are arranged between both magnetic structures 6, 8. As can be seen in FIG. 4, both magnetic structures 6, 8 can be in direct contact with the excitation coil 2 and the sensor coil 3, respectively.

The integrated magnetic field sensor 1, in particular the component carrier 14 incorporating the sensor 1, for a monitoring unit according to the invention can be made of a stack comprising at least one electrically insulating layer structure 17 and at least one electrically conductive layer structure 19. FIG. 4 illustrates an example with the at least one excitation coil 2 and/or at least one sensor coil 3 being at least partially formed by the at least one electrically conductive layer structure 19, in particular by a plurality of parallel electrically conductive layer structures 19. In particular, the at least one of the coils 2, 3 of the sensor 1 comprises conductive windings 18, in particular at least partially formed by at least one electrically conducting layer structure. Preferably, a plurality of such layer structures is provided, in particular between two and six layers are provided.

The integrated magnetic field sensor 1 can be fixedly associated with the sensed element 7 or vice versa. In particular, the sensor can be connected with the sensed element 7, for example both parts glued or soldered together. On the other hand, the sensor 1 could also be movably associated with the sensed element 7 or vice versa. The sensor 1 and/or the sensed element 7 are preferably movable, for example as self-contained devices or integrated in such devices, or mounted on a movable support, for example a rail, a slider, a pivotable arm, a rotary table or the like.

This allows to adjust the distance between the sensor 1 and the sensed element 7 to comply with the requirements of the measurement task. This also allows to move the sensor 1 to the desired measurement position or to a succession of measurement positions, for example to scan at least a part of the sensed element 7. Such features are most of advantage when using the monitoring unit according to the present invention in connection with a sensed element 7 comprising or consisting of a metallic body, in particular when monitoring comprises the estimation of defects in said body.

The sensed element 7 and the sensor 1 could in particular be movable along a fixed direction, for example along a straight or curved line or a sequence of straight or curved lines. Another embodiment provides for a movement along a random direction or in deliberate manner.

As suggested above, referring to adjust the system comprising the integrated magnetic field sensor 1 and the sensed element 7 to the specific needs, said sensor 1 can be positioned in proximity of the sensed element 7. Otherwise, the sensor 1 is suitable to be placed as to be at the proximity of the sensed element 7. Such arrangements are depicted in particular in FIGS. 2 to 4. A particular embodiment is characterized by the integrated magnetic field sensor 1 in contact with the sensed element 7, omitting as good as possible any gaps or distance between said parts. For this purpose, the at least one excitation coil 2 and/or the at least one sensor coil 3 is provided at a distance or is suitable to be placed as to be at a distance from the sensed element 7 equal or less of 20 μm.

The sensed element itself can, as another example for the possible use of the monitoring unit 1 according to the invention, comprise a stack of at least one electrically insulating layer structure and at least one electrically conductive layer structure. A preferred example for such stack could be a component carrier, even the component carrier 14 being the support structure for the sensor 1 and wherein the integrated magnetic field sensor 1 is associated to at least a portion of said at least one electrically conductive layer structure. The integrated magnetic field sensor 1 can be at least partially integrated in the stack, preferably comprising at least a portion 19 of at least one electrically conductive layer structure and/or at least a portion of the electrically insulating layer structure of the stack.

With a monitoring unit as described in this document, highly sensitive sensing or detecting (of differences) of magnetic fields and/or small currents is possible, for example currents smaller than 10 μA, in particular smaller than 100 nA, and/or the corresponding created magnetic fields, for example smaller than $10^{-5}$ T in particular smaller than $10^{-7}$ T. Further, sensing or detecting a magnetic field or simultaneously sensing or detecting a plurality of magnetic fields over a broad detection range is possible, for example in the range from $10^{-7}$ T to 1 T, in particular $10^{-6}$ T to $10^{-2}$ T.

The preferred method of performing measurements with a monitoring unit according to the invention comprises at least the step of measuring at least one component of a magnetic field through an integrated magnetic field sensor 1 as described so far and in a configuration where the integrated magnetic field sensor 1 and the sensed component 7 are associated one to each other. The magnetic field can be generated by the sensed component 7 independently from the sensor 1 or can be generated by the magnetic field sensor 1 itself, which is then altered or affected by the sensed component 7 or the physical, chemical or other processes therein. Preferably, the sensed element 7 comprises an electrically conductive material, for example a wire (FIG. 1), a wire loop (FIG. 3) or the like, with the method additionally comprising the step to provide the electric current passage through the sensed element.

The first magnetic structure 6 and/or the second magnetic structure 8 can be configured to generate a magnetic field if supplied by an electric current. Using this optional feature of the invention, the method of measuring at least a component of a magnetic field can additionally comprise the step of supplying electric current to the first magnetic structure 6 and/or the second magnetic structure 8 whenever the monitoring of the sensed element 7 shall be performed.

The process steps for performing the above-explained monitoring method can be controlled by any programmable computer device, connected to the monitoring unit and in particular with the integrated magnetic field sensor 1. This computer device is provided with a program element, which allows the operation of the computer to monitor a sensed element 7, when being executed by one or a plurality of processors. In addition, a computer program product can be provided, for example on a computer-readable medium, which computer program comprises instructions to monitor a sensed element 7, when executed by one or a plurality of processors or a computer device.

What is claimed is:

1. A monitoring unit comprising:

a laminated component carrier comprising a plurality of stacked and bonded layers of electrically insulating layer structures and electrically conductive layer structures;

an integrated magnetic field sensor, said integrated magnetic field sensor comprising:

at least one excitation coil formed in a first one of the electrically conductive layer structures, at least one sensor coil formed in a second one of the electrically conductive layer structures, and a first magnetic structure integrated into the laminated component carrier; and a sensed element associated with said integrated magnetic field sensor, said sensed element being suitable to alter a magnetic field of the integrated magnetic field sensor.

2. The monitoring unit according to claim 1, wherein the integrated magnetic field sensor has a planar shape, defining two main surfaces arranged in front of the sensed element.

3. The monitoring unit according to claim 1, further comprising a second magnetic structure, wherein the at least one excitation coil and the at least one sensor coil are disposed between the first magnetic structure and the second magnetic structure.

4. The monitoring unit according to claim 1, wherein the at least one excitation coil and/or the at least one sensor coil comprises conductive windings.

5. The monitoring unit according to claim 1, wherein the integrated magnetic field sensor is fixedly associated with the sensed element.

6. The monitoring unit according to claim 1, wherein the integrated magnetic field sensor is movably associated with the sensed element or vice versa.

7. The monitoring unit according to claim 1, wherein the sensed element is rotatable around a rotation axis.

8. The monitoring unit according to claim 1, wherein the integrated magnetic field sensor is disposed in proximity with the sensed element or is suitable to be placed in proximity with the sensed element.

9. The monitoring unit according to claim 1, wherein the at least one excitation coil and/or the at least one sensor coil is provided at a distance from the sensed element equal to or less than 20 μm.

10. The monitoring unit according to claim 1, wherein the sensed element comprises an electrically conductive wiring structure.

11. The monitoring unit according to claim 10, wherein:

the sensed element is fixedly integrated into one or more of the plurality of stacked and bonded layers of electrically insulating layer structures and electrically conductive layer structures; and the electrically conductive wiring structure of the sensed element is formed in a third one of the electrically conductive layer structures.

12. The monitoring unit according to claim 1, wherein the sensed element comprises at least one chamber in which an electric current flows from one portion to another portion, wherein the integrated magnetic field sensor is disposed on or in or in proximity with the at least one chamber.

13. A method for monitoring a sensed element with the monitoring unit according to claim 1, the method comprising the step of measuring at least one component of a magnetic field with the integrated magnetic field sensor.

14. The method according to claim 13, wherein at least one of the first magnetic structure and a second magnetic structure is configured to generate a magnetic field if supplied with an electric current, the method comprising the step of supplying the electric current to at least one of the first magnetic structure and the second magnetic structure when monitoring the sensed element.

15. A non-transitory computer-readable medium, having a computer program stored therein to monitor a sensed element, wherein the computer program, when being executed by one or a plurality of processors, is adapted to carry out or control the method according to claim 13.

16. A program element for monitoring a sensed element, wherein the program element, when executed by one or a plurality of processors, is adapted to carry out or control the method according to claim 13.

17. The monitoring unit according to claim 1, wherein:

a surface of said integrated magnetic field sensor is associated with the sensed element, and/or said integrated magnetic field sensor has a planar shape defining a main surface arranged in front of said sensed element.

18. The monitoring unit according to claim 11, wherein the third one of the electrically conductive layer structures is bonded by heat and pressure to the first one of the electrically conductive layer structures and the second one of the electrically conductive layer structures.

19. The monitoring unit according to claim 1, wherein the sensed element is glued or soldered to the laminated component carrier.

20. A method of monitoring a sensed element comprising the steps of:

providing a monitoring unit comprising:

a laminated component carrier comprising a plurality of stacked and bonded layers of electrically insulating layer structures and electrically conductive layer structures, and an integrated magnetic field sensor comprising at least one excitation coil formed in a first one of the electrically conductive layer structures, and at least one sensor coil formed in a second one of the electrically conductive layer structures, wherein the at least one excitation coil and the at least one sensor coil are both provided on one side of a first magnetic structure;

providing the sensed element in a position associated with the integrated magnetic field sensor with the sensed element;

operating the sensed element to alter a magnetic field of the integrated magnetic field sensor; and using the integrated magnetic field sensor to monitor the sensed element.

21. The method according to claim 20, wherein the sensed element comprises a metallic body.

22. The method according to claim 20, wherein the sensed element is fixedly integrated into one or more of the plurality of stacked and bonded layers of electrically insulating layer structures and electrically conductive layer structures.

* * * * *